US012567719B2

(12) United States Patent
Kanazawa et al.

(10) Patent No.: US 12,567,719 B2
(45) Date of Patent: Mar. 3, 2026

(54) OPTICAL SEMICONDUCTOR CHIP

(71) Applicant: NTT, Inc., Tokyo (JP)

(72) Inventors: Shigeru Kanazawa, Musashino (JP);
Yuta Ueda, Musashino (JP); **Takahiko
Shindo, Musashino (JP); Meishin Chin**,
Musashino (JP)

(73) Assignee: NTT, Inc., Tokyo (JP)

( * ) Notice: Subject to any disclaimer, the term of this
patent is extended or adjusted under 35
U.S.C. 154(b) by 755 days.

(21) Appl. No.: 17/915,948

(22) PCT Filed: Apr. 17, 2020

(86) PCT No.: PCT/JP2020/016938
§ 371 (c)(1),
(2) Date: Sep. 29, 2022

(87) PCT Pub. No.: WO2021/210178
PCT Pub. Date: Oct. 21, 2021

(65) Prior Publication Data
US 2023/0163563 A1     May 25, 2023

(51) Int. Cl.
H01S 5/042          (2006.01)
H01S 5/22           (2006.01)
(Continued)

(52) U.S. Cl.
CPC ........ H01S 5/0427 (2013.01); H01S 5/04254
(2019.08); H01S 5/04256 (2019.08);
(Continued)

(58) Field of Classification Search
CPC ................... H01S 5/2213; H01S 5/222; H01S
5/227–2277; H01S 5/04254;
(Continued)

(56) References Cited

U.S. PATENT DOCUMENTS 4,845,723 A * 7/1989 Heinen ................. H01S 5/4025
                                                        372/50.1
6,057,954 A * 5/2000 Parayanthal .......... G02F 1/0327
                                                        372/38.1
(Continued)

FOREIGN PATENT DOCUMENTS

CN        114039668 B  * 12/2024  ........... H01S 5/0261
JP        H0851256 A   *  2/1996  ............. H01L 24/05
(Continued)

OTHER PUBLICATIONS

W. Kobayashi et al., *High-speed operation at 50 Gb/s and 60-km
SMF transmission with 1.3-μm InGaAlAs-based DML*, IEEE, 2012,
pp. 50-51.
(Continued)

*Primary Examiner* — Tod T Van Roy
(74) *Attorney, Agent, or Firm* — Workman Nydegger

(57) ABSTRACT

An optical semiconductor chip of the present disclosure
includes a high frequency line between an electrode pad
receiving a modulation signal and a modulation electrode on
the optical waveguide constituting a laser. The depletion
layer capacitance generated in an active layer of the optical
waveguide is cancelled by an inductance component of the
high frequency line. When a portion directly below the high
frequency line is embedded with a low-dielectric-constant
material or is made hollow, the parasitic capacitance is
further reduced. The high frequency line may have a zigzag
shape as well as a linear shape. The electrode pad on the
optical semiconductor chip can be connected to other sub-
strates including RF lines for modulation signal input by
bumps or wire bonding.

5 Claims, 8 Drawing Sheets

(51) Int. Cl.
  *H01S 5/062* (2006.01)
  *H01S 5/227* (2006.01)
(52) U.S. Cl.
  CPC ........ *H01S 5/2213* (2013.01); *H01S 5/06226*
    (2013.01); *H01S 5/222* (2013.01); *H01S 5/227*
    (2013.01)
(58) Field of Classification Search
  CPC ............... H01S 5/04256; H01S 5/0427; H01S
    5/06213; H01S 5/06226
  See application file for complete search history.

(56) References Cited

U.S. PATENT DOCUMENTS

| | | | | |
|---|---|---|---|---|
| 11,681,166 | B2 * | 6/2023 | Adams | G02F 1/015 |
| | | | | 372/26 |
| 12,341,315 | B2 * | 6/2025 | Kanazawa | H01S 5/0085 |
| 2006/0222037 | A1 * | 10/2006 | Masuda | H01S 5/227 |
| | | | | 372/81 |
| 2015/0349490 | A1 * | 12/2015 | Taguchi | H01S 5/22 |
| | | | | 372/38.05 |

| | | | | |
|---|---|---|---|---|
| 2017/0310078 | A1 * | 10/2017 | Hirayama | H01S 5/02345 |
| 2018/0287339 | A1 * | 10/2018 | Nakanishi | H01S 5/2275 |
| 2021/0296850 | A1 * | 9/2021 | Lin | H01S 5/0609 |
| 2021/0359761 | A1 * | 11/2021 | Misawa | H01S 5/06226 |
| 2023/0139615 | A1 * | 5/2023 | Kanazawa | G02F 1/0121 |
| 2023/0163563 | A1 * | 5/2023 | Kanazawa | H01S 5/2213 |
| | | | | 372/26 |

FOREIGN PATENT DOCUMENTS

| | | | | |
|---|---|---|---|---|
| JP | 2000151010 A | * | 5/2000 | ............ H01S 5/042 |
| JP | 2011-009456 A | | 1/2011 | |
| JP | 2016-018796 A | | 2/2016 | |
| JP | 2017-199906 A | | 11/2017 | |

OTHER PUBLICATIONS

Shigeru Kanazawa et al., *Equalizer-Free Transmission of 100-Gb/s 4-PAM Signal Generated by Flip-Chip Interconnection EADFB Laser Module*, Journal of Lightwave Technology, vol. 35, No. 4, Feb. 15, 2017, pp. 775-780.

* cited by examiner (a)

PRIOR ART

OPTICAL SEMICONDUCTOR CHIP

BACKGROUND ART

The present invention relates to an optical semiconductor chip used in an optical transmitter or the like. The capacity of optical communication is increasing from backbone networks to access system networks. Larger capacities and higher performance are also required for optical transmitters, and a high-speed optical modulator is required as one key technology. Direct modulation is a method of modulating an optical signal from a light source (semiconductor laser) itself. For example, a method of directly modulating an output intensity of a semiconductor laser by controlling a current of the laser is known.

FIG. 1 shows diagrams of a configuration of a direct modulation laser chip in the conventional art. FIG. 1(a) shows a top view of a part of an optical semiconductor chip 10 in which an optical semiconductor laser is formed, and FIG. 1(b) shows a cross-sectional view of the substrate taken along the line Ib-Ib. First, referring to the cross-sectional view of FIG. 1(b), an optical semiconductor laser has an optical waveguide structure in which an active layer 15 and a p-type semiconductor layer 14 are formed on an n-type semiconductor substrate 16. Both sides of an optical waveguide are embedded with an insulation layer 13. It should be noted that, the above optical waveguide constitutes a semiconductor laser, but FIG. 1 shows only a modulation unit which is a part of the entire optical waveguide (FIG. 2) constituting the laser. Oscillation light generated in the laser unit is modulated by applying a baseband signal (hereinafter referred to as a modulation signal) to a modulation electrode 12 formed on the p-type semiconductor layer 14. Referring to FIG. 1(a), in order to input a modulation signal via wire bonding, bumps or the like, the electrode is extended from the modulation electrode 12 substantially perpendicular to the optical waveguide, and an electrode pad 11 is formed. The electrode pad 11 has a size of about 40 to 100 μm square, and has a structure directly connected to the modulation electrode 12.

A portion under the electrode pad 11 is embedded with a material 17 having a lower dielectric constant than that of the semiconductor insulation layer 13, and thereby the parasitic capacitance of the electrode pad 11 is reduced. When the parasitic capacitance of the electrode pad 11 receiving a modulation signal is reduced, deterioration of frequency response characteristics is prevented in a high frequency range exceeding 10 GHz.

The above direct modulation laser chip is formed on an optical semiconductor substrate having a function of conversion between light and electricity, and although not limited, in many cases, a chip is realized by disconnecting a plurality of circuits formed on a wafer-shaped optical semiconductor substrate. The direct modulation laser chip shown in FIG. 1 is also called an optical semiconductor chip.

FIG. 2 shows diagrams of a configuration of a subassembly in which an optical semiconductor chip including a direct modulation laser is mounted. FIG. 2(a) is a top view of a subassembly 20, and FIG. 2(b) shows a cross-sectional view of the subassembly 20 taken along the line IIb-IIb. Referring to FIG. 2(b), in the subassembly 20, a radio frequency (RF) wiring board 22 and the optical semiconductor chip 10 are mounted on the subcarrier 21. The RF wiring board 22 and the optical semiconductor chip 10 are connected by a terminator integrated chip 23 via gold bumps 24a and 24b.

Referring to FIG. 2(a), the RF wiring board 22 includes an RF pattern 25 receiving a modulation signal, and similarly, an RF pattern is formed in the terminator integrated chip 23. In the terminator integrated chip 23, a resistor 26 for terminating a modulation signal is formed. The RF pattern 25 is electrically connected to the electrode pad 11 of the optical semiconductor chip 10 via the gold bump 24a, the terminator integrated chip 23, and the gold bump 24b.

FIG. 3 is a diagram showing an equivalent circuit model of a subassembly in which an optical semiconductor chip in the conventional art is mounted. An equivalent circuit model 30 corresponds to the entire subassembly 20 in FIG. 2, and is divided into a laser chip part equivalent circuit 34 corresponding to the optical semiconductor chip 10 in FIG. 1 and another equivalent circuit part corresponding to the RF wiring board 22 and the terminator integrated chip 23. The other equivalent circuit part is composed of the RF pattern 25, an impedance 32 corresponding to the terminator integrated chip 23, and an inductor component 33 of a gold bump.

CITATION LIST

Non Patent Literature

[NPL 1] W. Kobayashi et. al., "High-speed operation at 50 Gb/s and 60-km SMF transmission with 1.3-μm InGaAlAs-based DML", 2012. in Proc. ISLC2012 TuB1
[NPL 2] S. Kanazawa et. al., "Equalizer-free transmission of 100-Gbit/s 4-PAM signal generated by flip-chip interconnection EADFB laser module", Feb. 15, 2017, JOURNAL OF LIGHTWAVE TECHNOLOGY, VOL. 35, NO. 4

SUMMARY OF THE INVENTION

Technical Problem

Here, focusing on an equivalent circuit 34 of an optical semiconductor chip 10, a parasitic capacitance 36 corresponding to an electrode pad 11 has already been considerably reduced by the configuration such as embedding a low-dielectric-constant material 17 shown in FIG. 1. For bandwidth characteristics of an optical modulator, a depletion layer capacitance 37 in an equivalent circuit 35 corresponding to a laser unit having an active layer 15 has a dominant influence in the equivalent circuit 34 of the laser unit in the optical semiconductor chip 10.

When a direct modulation laser having a higher speed and a wider bandwidth is realized, there is a new problem that frequency response characteristics are limited by the depletion layer capacitance in the optical waveguide of the laser unit. The present invention has been made in view of such problems, and an object of the present invention is to realize an optical modulator using a direct modulation laser having a higher speed and a wider bandwidth.

Means for Solving the Problem

In order to achieve such an object, one embodiment of the present invention provides an optical semiconductor chip including: a laser light source having an optical waveguide structure, the structure having a first type semiconductor base layer, an active layer and a second type semiconductor layer arranged in this order; an electrode pad receiving a modulation signal; a modulation electrode being formed on the second type semiconductor layer; and a high frequency line connecting the electrode pad and the modulation electrode and providing inductance in series with respect to a depletion layer capacitance of the optical waveguide. The optical semiconductor chip can operate as a direct modulation laser.

Effects of the Invention

As described above, the present invention realizes an optical modulator having a higher speed and a wider bandwidth.

DESCRIPTION OF EMBODIMENTS

An optical semiconductor chip including a direct modulation laser of the present disclosure includes a high frequency line between an electrode pad receiving a modulation signal and a modulation electrode on an optical waveguide having an active layer. A depletion layer capacitance of the optical waveguide is cancelled by an inductor component of the high frequency line. When a portion directly below the high frequency line is embedded with a low-dielectric-constant material or is made hollow, the parasitic capacitance is further reduced. The high frequency line may have a zigzag (meander) shape as well as a linear shape. The electrode pad on the optical semiconductor chip can be connected to other substrates including RF lines via bumps or wire bonding.

Figure 1:
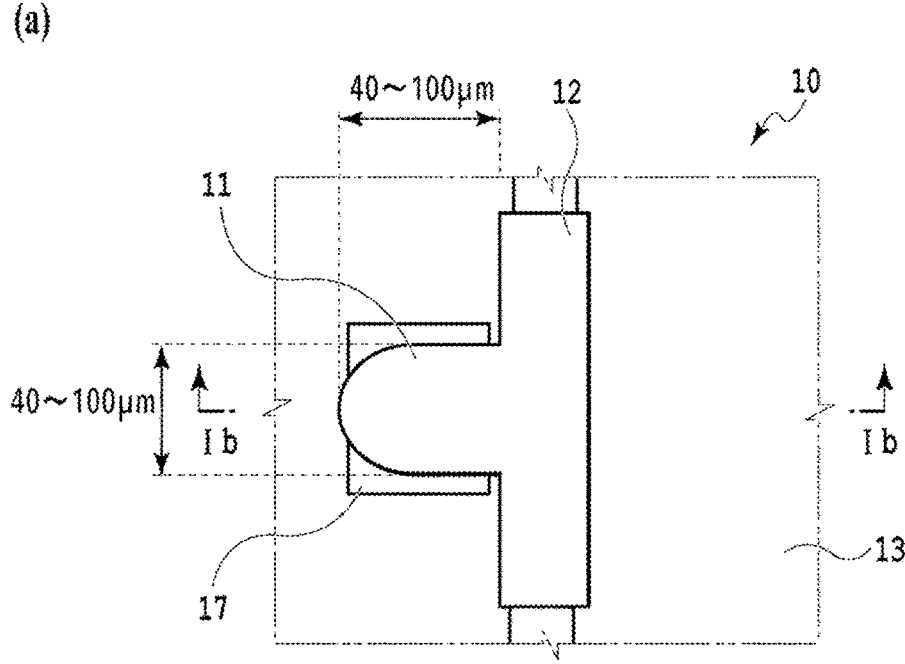
FIG. 1 shows diagrams of a configuration of a direct modulation laser chip in the conventional art.
Figure 1:
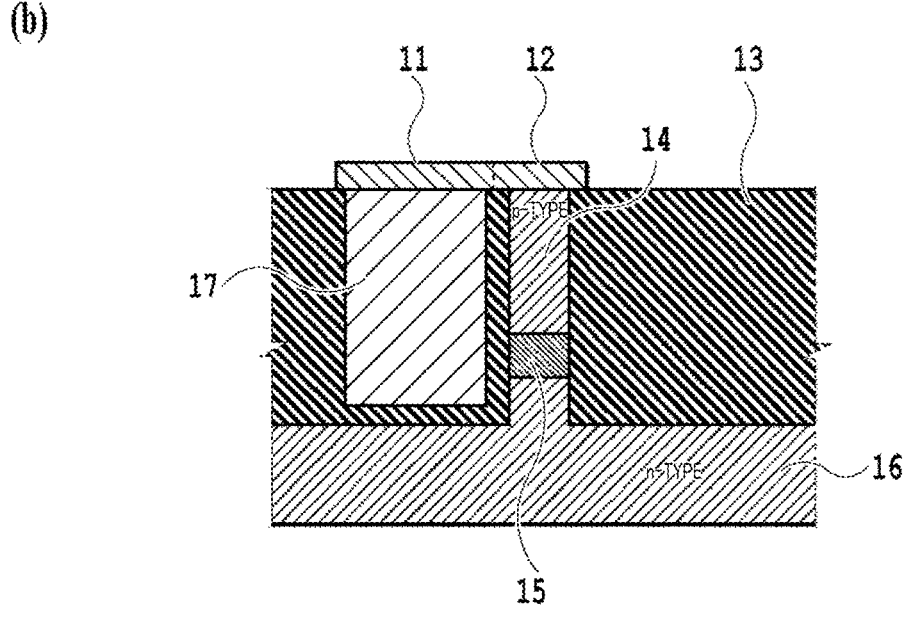
Figure 4:
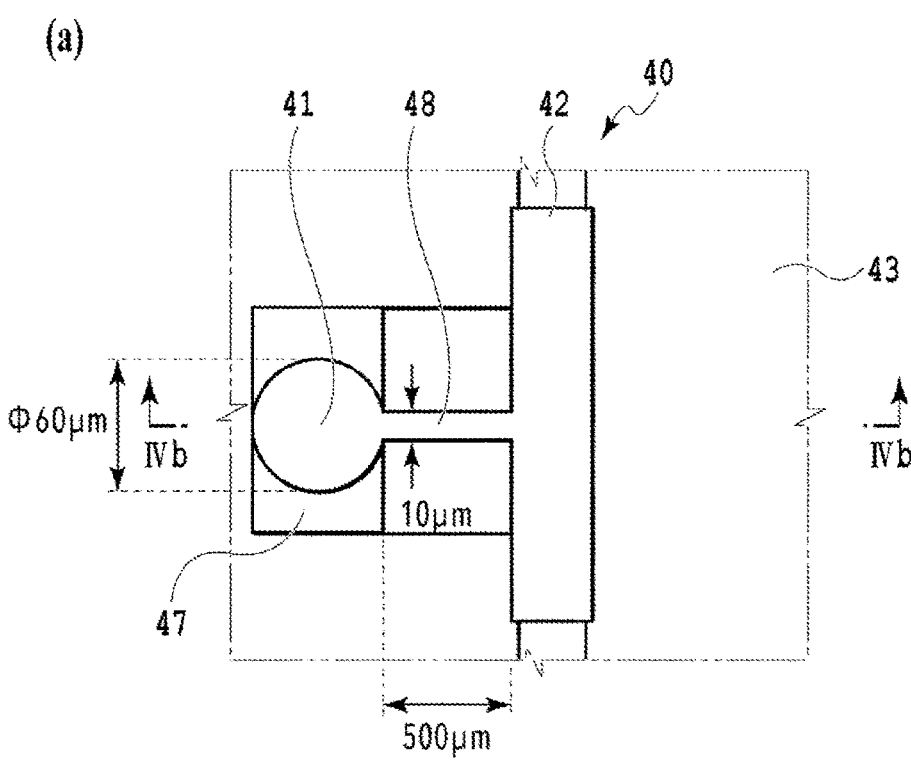
FIG. 4 shows diagrams of a configuration of an optical semiconductor chip including a direct modulation laser of the present disclosure.
Figure 4:
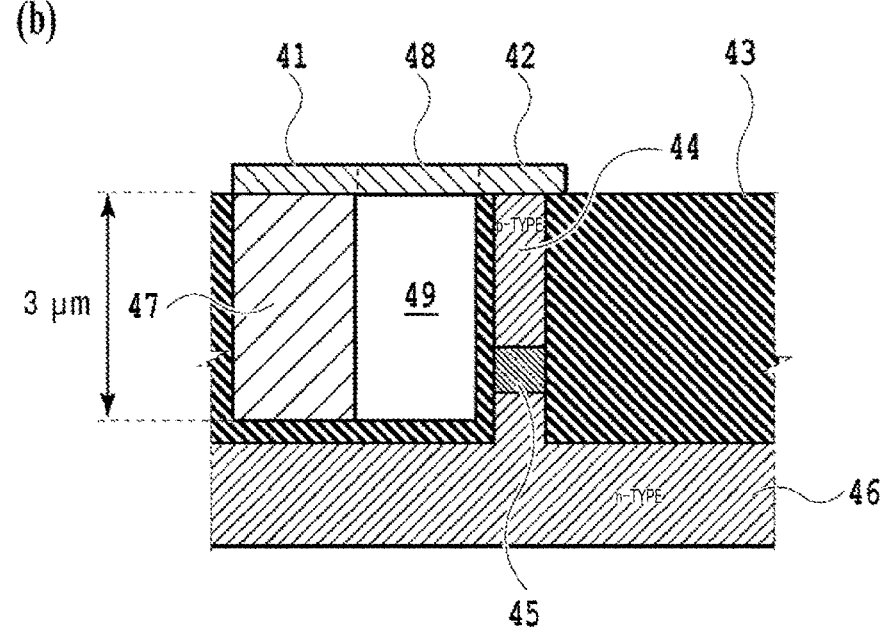

FIG. 4 shows diagrams of a configuration of the optical semiconductor chip including the direct modulation laser of the present disclosure. Similar to FIG. 1 shown in the configuration in the conventional art, FIG. 4(*a*) shows a top view of a part of an optical semiconductor chip 40 in which a direct modulation laser is formed, and FIG. 4(*b*) shows a cross-sectional view of the substrate taken along the line IVb-IVb. First, referring to the cross-sectional view of FIG. 4(*b*), the direct modulation laser has an optical waveguide structure in which an optical active layer 45 and a p-type semiconductor layer 44 are formed on an n-type semiconductor substrate 46. One side of the optical waveguide is embedded with an insulation layer 43. On the other side, a portion directly below a region from the electrode pad to just before a modulation electrode 42 is replaced with a low-dielectric-constant material 47 and a hollow portion 49. Like the direct modulation laser in the conventional art shown in FIG. 1, the above optical waveguide structure constitutes a semiconductor laser. Oscillation light in the laser unit is modulated by a modulation signal applied to the modulation electrode 42 formed on the p-type semiconductor layer 44. The difference from the configuration of the optical semiconductor chip in the conventional art is a configuration between an electrode pad 41 and the modulation electrode 42.

Referring to the top view of FIG. 4(*a*), a high frequency line 48 is provided between the electrode pad 41 receiving a modulation signal via wire bonding, bumps or the like, and the modulation electrode 42. The high frequency line 48 connects the electrode pad 41 and the modulation electrode 42 in a bridge shape by forming a portion directly therebelow as the hollow portion 49. The high frequency line 48 operates as a high-frequency-transmission line having an inductive impedance up to a predetermined length at a frequency corresponding to a modulation symbol rate. That is, the high frequency line 48 operates as an inductor (inductive reactance) added in series with respect to the laser unit when viewed from the modulation input side.

A portion directly below the electrode pad 41 is embedded with the low-dielectric-constant material 47, and a portion directly below the high frequency line 48 is the hollow portion 49. According to the configuration directly below the electrode from the electrode pad 41 to the modulation electrode 42, the capacitive impedance component in the electrode pad 41 and the high frequency line 48 can be made as small as possible. After an electrode on the entire top part of the chip is formed, by selectively etching and removing only a portion under the high frequency line 48 and leaving the high frequency line 48 in a bridge shape, such a hollow portion 49 can be formed. In addition, as shown in FIG. 4, instead of making the entire portion directly below the high frequency line 48 hollow, only a portion directly below the high frequency line 48 may be hollow, or the low-dielectric-constant material 47 may be embedded up to a location right next to the modulation electrode 42 without the hollow portion. When the low-dielectric-constant material 47 or the hollow portion 49 is combined with the high frequency line 48 that adds inductance to the laser unit in series, the capacitive impedance component of the electrode pad 41 and the high frequency line 48 can be further reduced.

Therefore, the optical semiconductor chip of the present disclosure is an optical semiconductor chip including a laser light source having an optical waveguide structure, the structure having a first type semiconductor base layer, an active layer and a second type semiconductor layer arranged in this order, an electrode pad receiving a modulation signal, a modulation electrode being formed on the second type semiconductor layer, and a high frequency line connecting the electrode pad and the modulation electrode and providing inductance in series with respect to a depletion layer capacitance of the optical waveguide can be implemented. Here, the first type and the second type correspond to the type of doping of each part of the above optical waveguide. In the example of FIG. 4, the first type may be an n-type semiconductor, and the second type may be a p-type semiconductor. These types can be reversed. The semiconductor base layer corresponds to a semiconductor substrate on which a direct modulation laser chip is formed.

Figure 2:
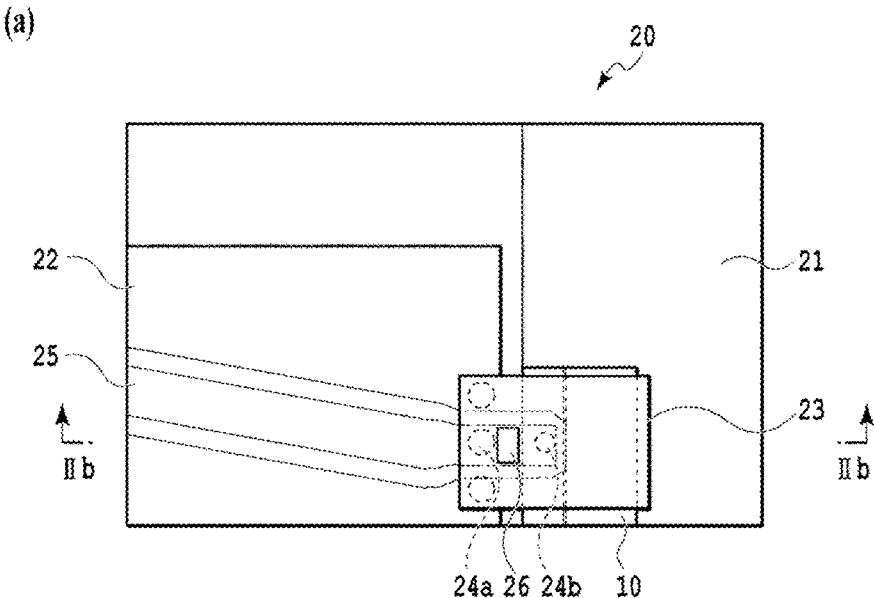
FIG. 2 shows diagrams of a configuration of a subassembly in which a direct modulation laser chip is mounted.
Figure 2:
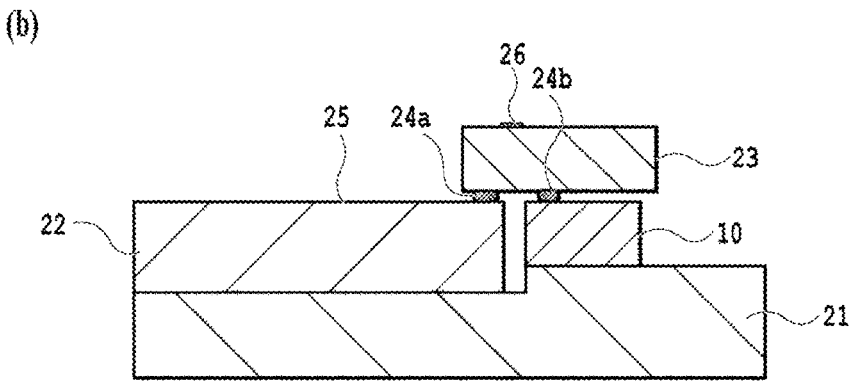
Figure 5:
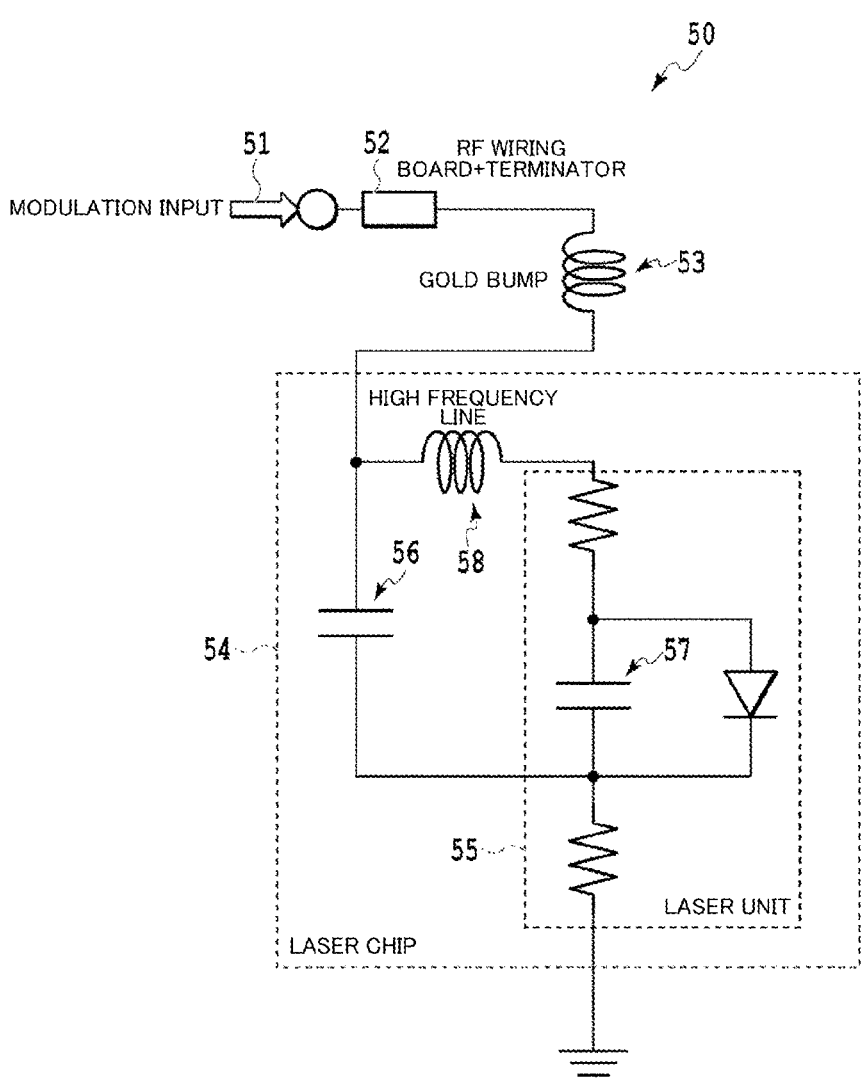
FIG. 5 is a diagram showing an equivalent circuit model of a direct modulation laser subassembly of the present disclosure.

FIG. 5 is a diagram showing an equivalent circuit model of a subassembly including the optical semiconductor chip of the present disclosure. In the optical semiconductor chip 40 of the present disclosure shown in FIG. 4, the configuration between the electrode pad 41 and the modulation electrode 42 is different from that of a direct modulation laser chip 10 in the conventional art. Therefore, the optical semiconductor chip 40 can be mounted in the same configuration as the subassembly shown in FIG. 2. Therefore, an optical semiconductor chip 10 in FIG. 2 is replaced with the optical semiconductor chip 40 with the configuration in FIG. 4, and can be mounted as a subassembly as in FIG. 2 together with an RF wiring board 22 on a subcarrier 21 and a terminator integrated chip 23.

Figure 3:
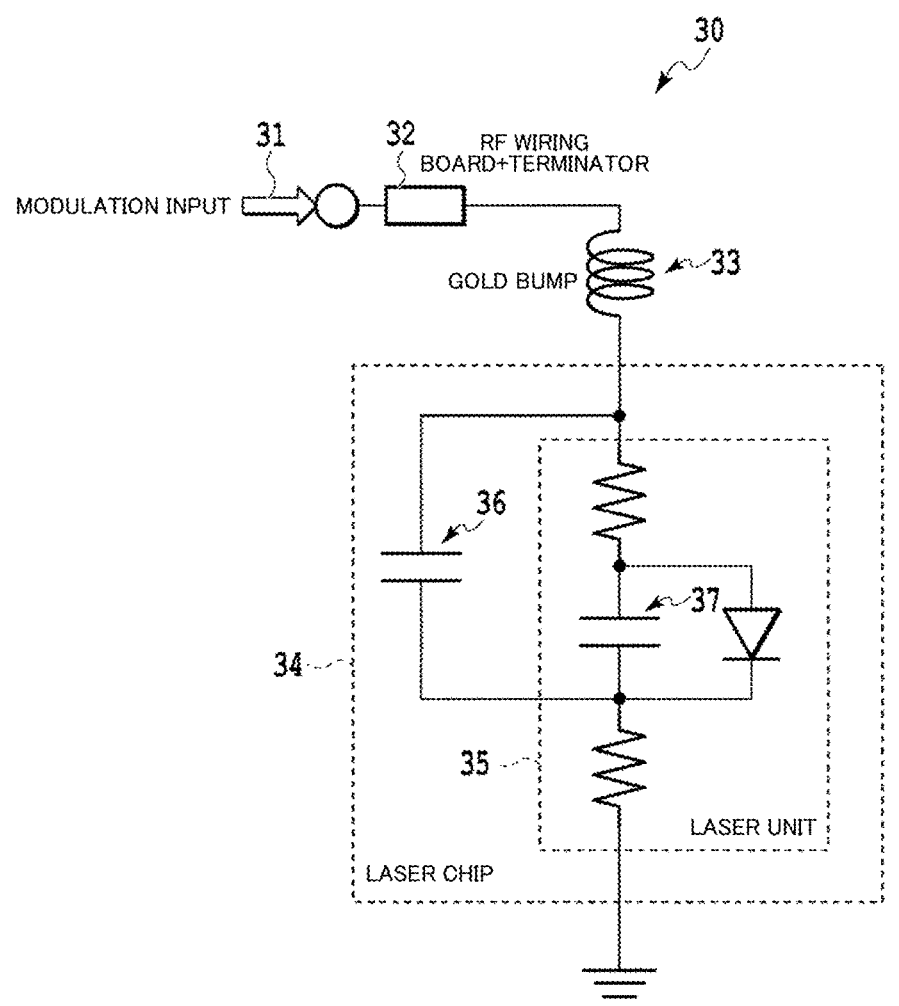
FIG. 3 is a diagram showing an equivalent circuit model of a subassembly in the conventional art.

In an equivalent circuit 50 shown in FIG. 5, an impedance 52 corresponding to an RF pattern 25 and a terminating resistor 26, and an inductor component 53 of a gold bump are the same as those of the equivalent circuit in FIG. 3. Only an equivalent circuit 54 of a chip part corresponding to the optical semiconductor chip 40 including a direct modulation laser is different from the equivalent circuit of the subassembly in the conventional art in FIG. 3. That is, in the equivalent circuit 54 of the laser chip part corresponding to the optical semiconductor chip 40, an inductance 58 corresponding to the high frequency line 48 is included in series between a parasitic capacitance 56 of the electrode pad 41 and an equivalent circuit 55 of the laser unit corresponding to the optical waveguide. A depletion layer capacitance 57 in the equivalent circuit 55 of the laser unit and the inductance 58 are connected in series. Therefore, the decrease in impedance of a capacitive impedance 57 in a high frequency range due to the depletion layer capacitance can be cancelled (resonated) by the increase in impedance of the inductance 58 of the high frequency line 48. Thereby, the reactance component when the chip is viewed from the modulation input side can be made substantially constant, and it is possible to improve frequency response characteristics of modulation characteristics. Hereinafter, examples will be described in more detail.

Example 1

Referring to FIG. 4 again, as an example, in the optical semiconductor chip 40 including the direct modulation laser of the present disclosure, InP, GaAs or Si can be used for a substrate. The length of the direct modulation laser (the modulation electrode 42) was 100 μm, the signal line width of the high frequency line 48 was 10 μm, the line length was 500 μm, the thickness of the low-dielectric-constant material 47 was 3 μm, and the specific dielectric constant was 2.3. The electrode pad 41 had a circular shape with a diameter of 60 μm. As the example of the low-dielectric-constant material 47, an organic material including a polyimide can be used.

In order to compare frequency response characteristics of the optical modulator unit of the optical semiconductor chip 40 of the present disclosure shown in FIG. 4 with those in the conventional art, the optical semiconductor chip 40 was mounted in the form of the subassembly shown in FIG. 2, and the performance of the direct modulation laser was checked. For comparison, a subassembly using the direct modulation laser chip 10 shown in FIG. 1 having the same structure as the optical semiconductor chip 40 except that the high frequency line 48 was not provided was formed. In a subassembly 20 shown in FIG. 2, for the RF wiring board 22 and the terminator integrated chip 23, a ceramic material such as aluminum nitride or a quartz plate can be used. For the subcarrier 21, an aluminum nitride substrate can be used. Here, the term "subassembly" refers to an intermediate functional block form for realizing an optical transmitter, an optical transmission device and the like including a direct modulation laser. The subassembly can be simply referred to as an assembly, a module or the like.

The optical waveguide of the direct modulation laser unit of the optical semiconductor chip 40 had a configuration in which the active layer 45 composed of a GaInAsP quantum well structure and the p-type semiconductor layer 44 composed of p-type InP were sequentially formed on the n-type InP substrate 46. The configuration of each part of these optical waveguides is an example, and in order to produce an optical waveguide of the direct modulation laser as described above, various configurations can be formed using InP, GaAs or Si for a substrate. In addition, in the configuration of the optical semiconductor chip 40 in FIG. 4, the substrate side was an n-type semiconductor, but the substrate side can also be a p-type semiconductor. In the electrode pad 41, both a DC bias current (10 to 100 mA) and a modulation signal (1.0 to 3.5 Vpp) were superimposed and applied to the modulation electrode 42 via the RF wiring board 22 from the outside.

Figure 6:
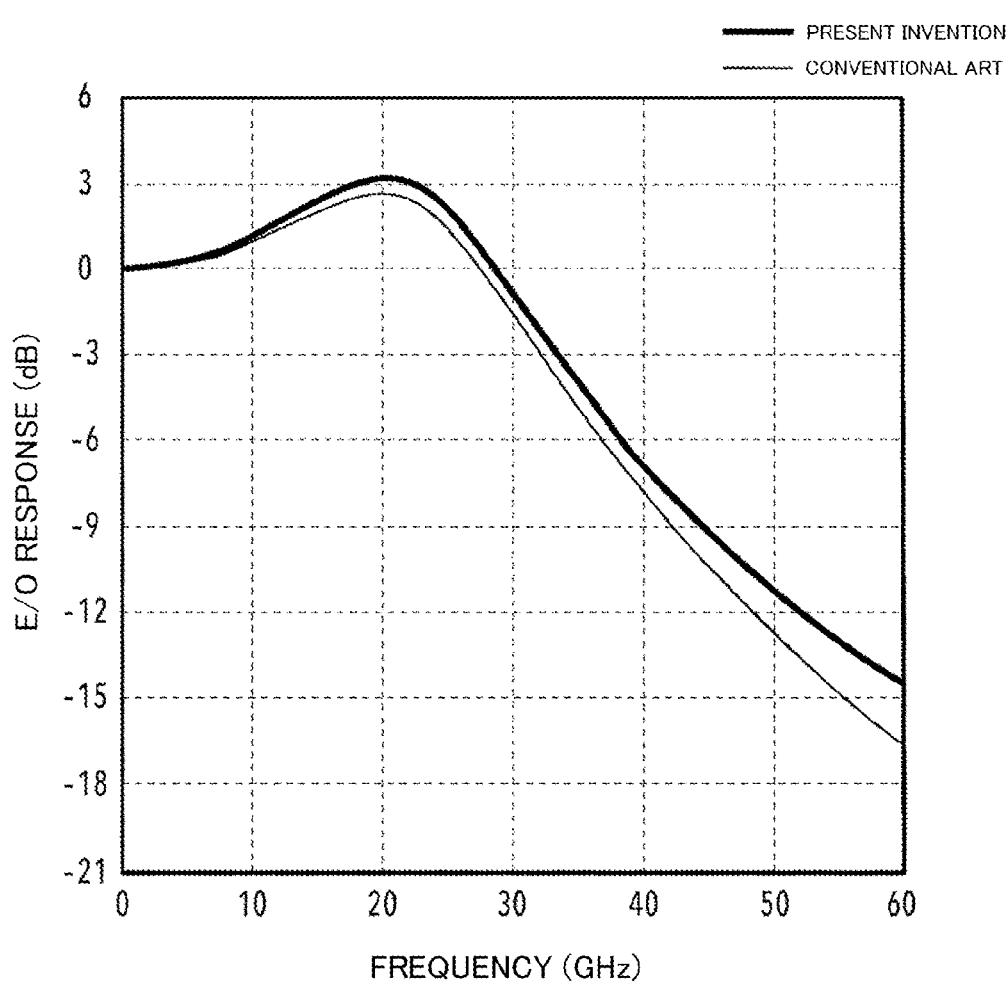
FIG. 6 is a diagram showing frequency response of the direct modulation laser subassembly of the present disclosure.

FIG. 6 is a diagram showing frequency response characteristics of a subassembly including the optical semiconductor chip including the direct modulation laser of the present disclosure. FIG. 6 shows frequency characteristics of electrical/optical response (E/O response) in dB. The E/O response can be acquired by an optical component analyzer or the like. In FIG. 6(*a*), the 3 dB bandwidth of the subassembly using the direct modulation laser chip in the conventional art was 32 GHz. On the other hand, when the optical semiconductor chip of the present disclosure in FIG. 4 was used, the bandwidth was 33 GHz, and the 3 dB bandwidth was widened and improved by about 1 GHz. In FIG. 6, it was confirmed that, according to the configuration including a high frequency line between the electrode pad receiving a modulation signal and the modulation electrode on the optical waveguide of the direct modulation laser, the modulation frequency response of the direct modulation laser was improved. In the next example of the optical semiconductor chip, a configuration example in which a meander structure was used as a high frequency line will be shown.

Example 2

Figure 7:
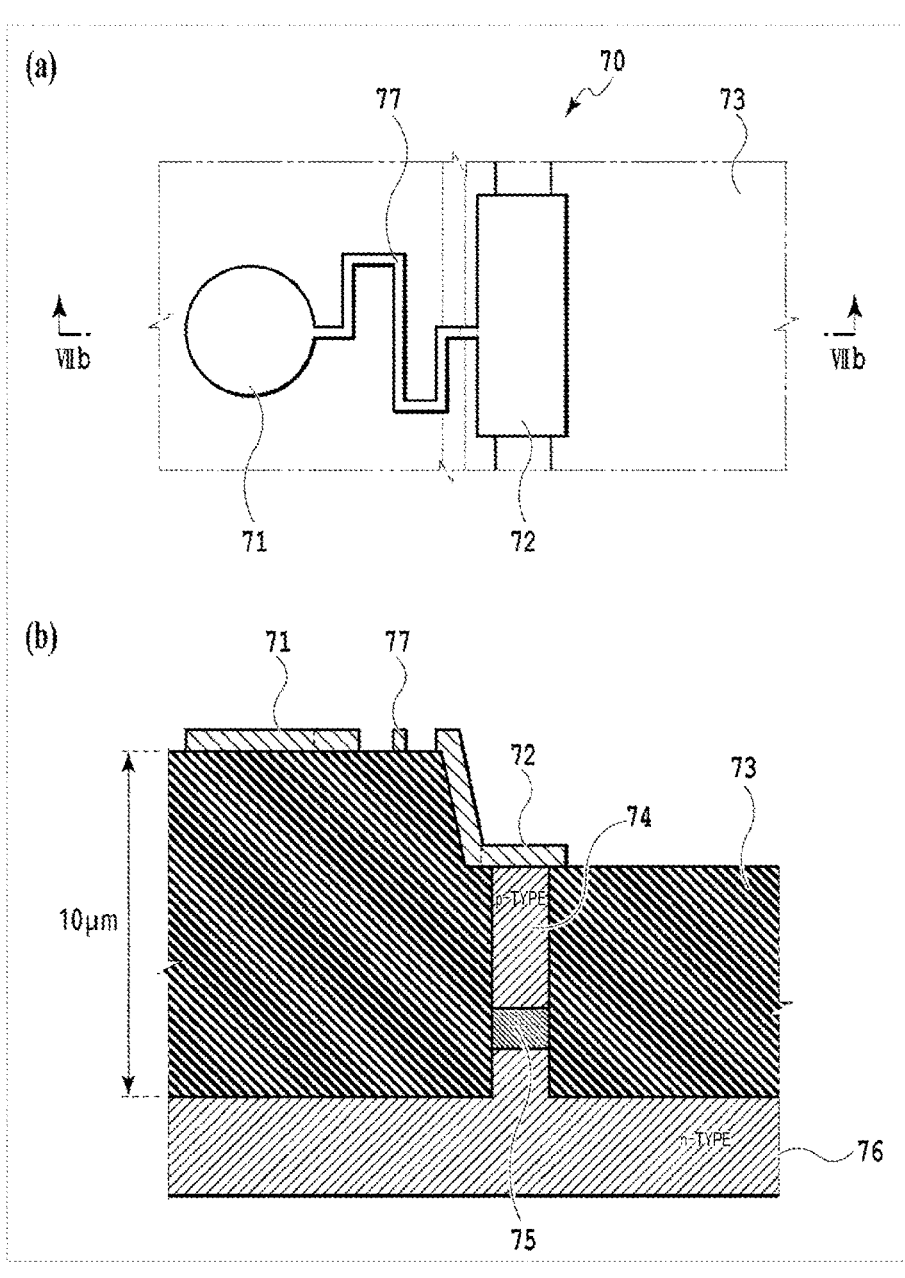
FIG. 7 shows diagrams of a configuration of an optical semiconductor chip including a direct modulation laser of Example 2.

FIG. 7 shows diagrams of a configuration of an optical semiconductor chip including a direct modulation laser of Example 2. FIG. 7(*a*) is a top view of a part of the optical semiconductor chip 70 in which a direct modulation laser is formed, and FIG. 7(*b*) shows a cross-sectional view of the substrate taken along the line VIIb-VIIb. Referring to the cross-sectional view of FIG. 7(*b*), the optical semiconductor chip 70 had an optical waveguide structure in which an active layer 75 and a p-type semiconductor layer 74 were formed on an n-type semiconductor substrate 76. Both sides of the optical waveguide were embedded by an insulation layer 73. In this configuration, an electrode pad 71 and a meander wiring 77 were set to be higher than a modulation electrode 72. The above optical waveguide constituted a semiconductor laser. Oscillation light generated in the laser unit was modulated by applying a modulation signal to the modulation electrode 72 formed on the p-type semiconductor layer 74. The above optical waveguide structure of the optical semiconductor chip 70 was the same as that of the structure of the optical semiconductor chip 40 of Example 1 in FIG. 4 except for the configuration of the insulation layer on both sides. The major difference from the optical semiconductor chip 40 in FIG. 4 was a configuration between the electrode pad 71 and the modulation electrode 72.

In this example, the electrode pad 71 and the modulation electrode 72 were connected by the meander wiring 77. In the semiconductor chip 70 in FIG. 7, the length of the direct modulation laser, that is, the modulation electrode 72, was 75 μm, and the high frequency line was formed as the meander wiring 77 having the three types of different inductances 0.12, 0.18, and 0.3 nH. The thickness the insulation layer 73 under the electrode pad 71 and the meander wiring 77 was set to 10 μm, which was higher than the top surface of the optical waveguide constituting the optical modulator, and the parasitic capacitance generated from the electrode pad 71 or the like was reduced. As in Example 1, in this configuration, the RF wiring board 22 and the terminator integrated chip 23 were connected using flip chip mounting, and a modulation signal was input to the electrode pad 71.

Figure 8:
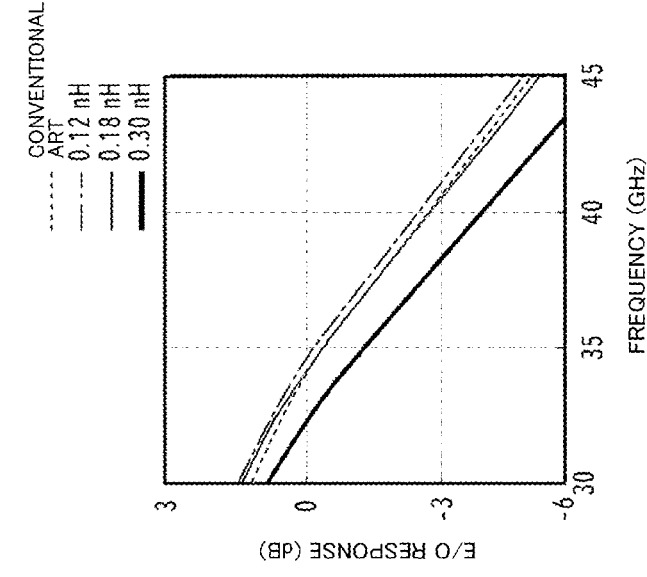
FIG. 8 shows diagrams of frequency response of a direct modulation laser subassembly of Example 2.
Figure 8:
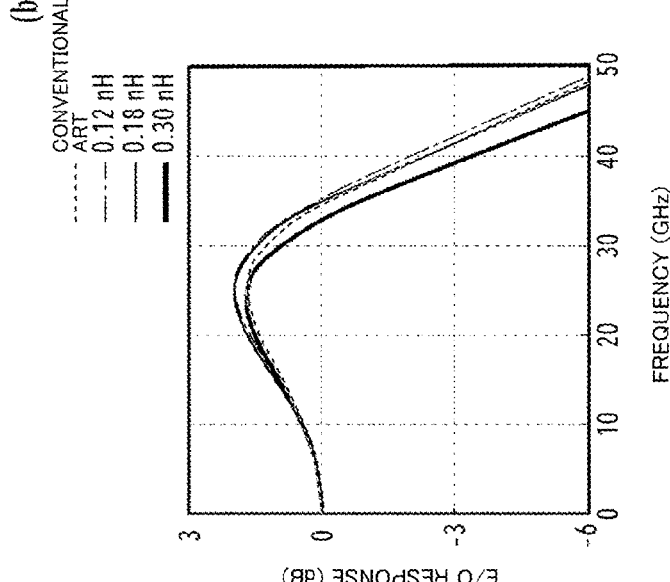

FIG. 8 shows diagrams of frequency response characteristics of a subassembly including the optical semiconductor chip including the direct modulation laser of Example 2. FIGS. 10(*a*) and 10(*b*) show frequency characteristics of each E/O response in different frequency ranges in dB. The meander wiring 77 having the three types of inductances 0.12, 0.18, and 0.3 nH is shown. In addition, characteristics of the subassembly when the direct modulation laser chip 10 in the conventional art in FIG. 1 was mounted in the form shown in FIG. 2 are shown. In FIG. 8(*b*), the 3 dB bandwidth of the subassembly using the direct modulation laser chip in the conventional art was 40.2 GHz. On the other hand, when the optical semiconductor chip including the meander wiring 77 of Example 2 shown in FIG. 6 was used, the bandwidth was 40.7 GHz, and the bandwidth was improved by about 0.5 GHz.

An optical semiconductor chip in which the inductance of the meander wiring 77 was set to 0.18 nH and 0.3 nH was mounted on the same subassembly, and frequency response characteristics were measured. In the results, in the case of 0.18 nH, the 3 dB bandwidth was the same as in the case of the configuration in the conventional art, and on the other hand, in the case of 0.3 nH, the 3 dB bandwidth was narrower than in the configuration in the conventional art. Therefore, it can be understood that, in the direct optical modulator composed of an InP substrate, the inductance added by the high frequency line was effectively 0.18 nH or less, and maximum improvement in the 3 dB bandwidth characteristics around 0.12 nH was expected. It was confirmed from the measured value that the inductance component added by the high frequency line was selected according to the depletion layer capacitance corresponding to the configuration of the optical modulator, and the modulation bandwidth of the direct modulation laser can be maximized.

Here, it has been confirmed that the amount of improvement in the 3 dB bandwidth when an inductance component is added in series depends on the length of the laser unit (modulation electrode). The results of FIG. 8 show an example when the laser length was 100 μm. For example, in the case of a shorter laser length, the above optimal inductance value around 0.12 nH changed to a smaller value. The configuration from the electrode pad to the modulation electrode in the direct modulation laser chip in the conventional art was for reducing unnecessary inductance and the capacitance as much as possible, and securing an electrode structure sufficient for wire bonding. Therefore, the length between the electrode pad and the modulation electrode was short as possible and reduced to a maximum of 30 μm or less. It should be noted that the direct modulation laser chip of the present disclosure differed from that in the conventional art in that the high frequency line operated as an inductor (inductive reactance) added in series to the laser unit when viewed from the modulation input side.

As described above, when the inductor component of the high frequency line was provided in series between the electrode pad in the direct modulation laser chip and the modulation electrode on the optical waveguide that functions as the optical modulator, the depletion layer capacitance of the optical waveguide was cancelled. The line width of the inductor component is not limited as long as it has a line width that provides a predetermined characteristic impedance at, for example, a frequency of the modulation signal (for example, the symbol frequency). In addition, the line length may be in a range in which the impedance of the high frequency line becomes an inductive reactance.

In order to reduce the parasitic capacitance in the optical waveguide and in order to add inductance in series, the width of the high frequency lines 48 and 77 is preferably narrow, but there is a problem of the physical strength of the electrode in a line width of microns or less. Therefore, the width of the high-frequency-line units 48 and 77 is preferably in a range of the diameter of the electrode pad 71 or less and 1 μm or more.

As described above in detail, according to the configuration of the optical semiconductor chip of the present disclosure, it is possible to realize a direct modulation laser having a higher speed and a wider bandwidth.

INDUSTRIAL APPLICABILITY

The present invention can be generally used in an optical communication system.

REFERENCE SIGNS LIST

10, 40, 70 Optical semiconductor chip
11, 41, 71 Electrode pad
12, 42, 72 Modulation electrode
13, 43, 73 Insulation layer
14, 44, 74 p-type semiconductor layer
15, 45, 75 Active layer
16, 46, 76 n-type semiconductor substrate
17, 47 Low-dielectric-constant material
20 Subassembly
21 Subcarrier
22 RF wiring board
23 Terminator integrated chip
36, 56 Parasitic capacitance
37, 57 Depletion layer capacitance
48, 77 High frequency line
49 Hollow portion

The invention claimed is:

1. An optical semiconductor chip, comprising:
a laser light source having an optical waveguide structure, the structure having a first type semiconductor base layer, an active layer and a second type semiconductor layer arranged in this order;
an electrode pad receiving a modulation signal;
a modulation electrode being formed on the second type semiconductor layer; and
a meander wiring connecting the electrode pad and the modulation electrode and providing inductance in series with respect to a depletion layer capacitance of the optical waveguide,
wherein a portion under the meander wiring and the electrode pad is composed of a material having a dielectric constant lower than a dielectric constant of the semiconductor base layer; and a thickness of the material is set such that a height of the meander wiring and the electrode pad is higher than a top surface of the optical waveguide.

2. The optical semiconductor chip according to claim 1, wherein a line width of the meander wiring is narrower than a width of the electrode pad.

3. The optical semiconductor chip according to claim 1, wherein the amount of inductance of the meander wiring is 0.18 nH or less.

4. The optical semiconductor chip according to claim 1, wherein the laser light source is a direct modulation laser.

5. An optical modulator assembly, comprising:

the optical semiconductor chip according to claim 1;

a chip in which terminators are integrated; and a wiring board for leading the modulation signal.

* * * * *